United States Patent
Yamamoto et al.

(10) Patent No.: US 8,710,586 B2
(45) Date of Patent: Apr. 29, 2014

(54) SIC SEMICONDUCTOR DEVICE AND METHOD FOR MANUFACTURING THE SAME

(75) Inventors: Toshimasa Yamamoto, Ichinomiya (JP); Masahiro Sugimoto, Toyota (JP); Hidefumi Takaya, Miyoshi (JP); Jun Morimoto, Nisshin (JP); Narumasa Soejima, Seto (JP); Tsuyoshi Ishikawa, Nisshin (JP); Yukihiko Watanabe, Nagoya (JP)

(73) Assignees: DENSO CORPORATION, Kariya (JP); Toyota Jidosha Kabushiki Kaisha, Toyota (JP)

( * ) Notice: Subject to any disclaimer, the term of this patent is extended or adjusted under 35 U.S.C. 154(b) by 245 days.

(21) Appl. No.: 13/229,892

(22) Filed: Sep. 12, 2011

(65) Prior Publication Data

US 2012/0061682 A1    Mar. 15, 2012

(30) Foreign Application Priority Data

Sep. 14, 2010    (JP) ................................. 2010-205789

(51) Int. Cl.
*H01L 29/66*    (2006.01)
*H01L 29/15*    (2006.01)

(52) U.S. Cl.
USPC .. 257/332; 257/77; 257/E29.084; 257/E29.26

(58) Field of Classification Search
USPC ..................... 257/E29.084, E29.26, 77, 332
See application file for complete search history.

(56) References Cited

U.S. PATENT DOCUMENTS

| | | | |
|---|---|---|---|
| 6,445,037 B1 * | 9/2002 | Hshieh et al. | 257/330 |
| 2004/0159885 A1 * | 8/2004 | Kawano et al. | 257/330 |
| 2009/0236612 A1 | 9/2009 | Nakamura et al. | |
| 2010/0006861 A1 * | 1/2010 | Yamamoto et al. | 257/77 |
| 2010/0308343 A1 | 12/2010 | Suzuki et al. | |

FOREIGN PATENT DOCUMENTS

| | | |
|---|---|---|
| JP | A-2002-270837 | 9/2002 |
| JP | 2009-266871 A | 11/2009 |

OTHER PUBLICATIONS

Office action mailed Feb. 18, 2014 in the corresponding JP application No. 2010-205789 (and English translation).

* cited by examiner

*Primary Examiner* — Daniel Luke
(74) *Attorney, Agent, or Firm* — Posz Law Group, PLC

(57) ABSTRACT

A SiC semiconductor device includes: a substrate, a drift layer, and a base region stacked in this order; first and second source regions and a contact layer in the base region; a trench penetrating the source and base regions; a gate electrode in the trench; an interlayer insulation film with a contact hole covering the gate electrode; a source electrode coupling with the source region and the contact layer via the contact hole; a drain electrode on the substrate; and a metal silicide film. The high concentration second source region is shallower than the low concentration first source region, and has a part covered with the interlayer insulation film, which includes a low concentration first portion near a surface and a high concentration second portion deeper than the first portion. The metal silicide film on the second part has a thickness larger than the first portion.

6 Claims, 8 Drawing Sheets

SIC SEMICONDUCTOR DEVICE AND METHOD FOR MANUFACTURING THE SAME

CROSS REFERENCE TO RELATED APPLICATION

This application is based on Japanese Patent Application No. 2010-205789 filed on Sep. 14, 2010, the disclosure of which is incorporated herein by reference.

TECHNICAL FIELD

The present invention relates to a silicon carbide semiconductor device having a trench gate structure and a method for manufacturing a silicon carbide semiconductor device.

BACKGROUND

Recently, a power device is made of silicon carbide (i.e., SiC) in order to obtain high electric field breakdown strength. Since the SiC semiconductor device has the high electric field breakdown strength, the device can control large current. Thus, the device can be used for various fields. For example, in an automobile industry field, the device may be used for controlling a motor in a hybrid vehicle (i.e., HV), an electric vehicle (i.e., EV), a fuel cell vehicle (FCV) and the like.

In the SiC semiconductor device, in order to flow a large current, it is effective to increase a channel density. In a silicon transistor, a trench gate type MOSFET can flow the large current. The SiC semiconductor device can have the trench gate structure. For example, in JP-A-2009-231545 corresponding to US 2009/0236612, the trench gate type SiC semiconductor device is described.

However, when the trench gate type MOSFET is formed in a SiC substrate, the following difficulties arise.

When a gate oxide film is formed, a damage and/or an impurity remain in a surface portion of the SiC substrate. The damage and the impurity are introduced in the substrate during a previous process. Specifically, the damage caused in a trench etching process may remain on a sidewall of a trench formed in the trench etching process. When the damage remains on the sidewall, current may be leaked through the damage. Thus, to remove the damage, a hydrogen etching process and/or a sacrifice oxidation process may be performed.

However, an oxidation rate in a high impurity concentration region is high so that the high impurity concentration region is oxidized rapidly. Accordingly, when the damage is removed, and the sacrifice oxidation process is performed until the damage is completely removed, a surface concentration in a source region having a high impurity concentration and formed at a shoulder of the trench (i.e., a corner of an opening side of the trench) is not maintained to be high concentration. Specifically, the concentration of a contact portion with the source electrode is not maintained to be high concentration. Thus, a contact resistance increases.

For example, in order to increase the concentration of the source region to be higher than the contact portion, a part of the source region disposed at a deep position is formed by an ion implantation method, and another part of the source region disposed at a shallow position is formed by an ion implantation method with using phosphorous (i.e., P), so that the concentration of the source region at the shallow position is higher than the source region at the deep position. For example, the concentration of the source region at the shallow position is $1\times10^{20}$ cm$^{-3}$. In this manufacturing process, the contact portion of the source region at the shallow position has an impurity concentration higher than the contact portion of the source region at the deep position, so that the contact resistance is reduced. However, the part of the source region at the shallow position is oxidized by the rapid oxidization effect, and after that, the part of the source region at the shallow position is removed when the sacrifice oxidation film is removed. Thus, the part of the source region, which has the high impurity concentration, may be removed. Thus, the contact portion between the source region and the source electrode does not provide the high impurity concentration portion, and therefore, the contact resistance increases. Further, the thickness of the source region is thinned, so that the cross sectional area of a current path is reduced. Accordingly, the resistance is further reduced.

Similar difficulties may arise not only in a case where the source region is formed by a method with using two different ions such as nitrogen and phosphorus but also in a case where the source region is formed by a method with using the same ion such that the part of the source region at the shallow position has the impurity concentration higher than the part of the source region at the deep position. Further, not only in a case of the trench gate type MOSFET but also in a case of a trench gate type IGBT, similar difficulties arise. Here, the damage is removed by the sacrifice oxidation method. Alternatively, when the damage is removed by a hydrogen etching method, the high impurity concentration layer is rapidly etched. Therefore, similar difficulties arise.

SUMMARY

In view of the above-described problem, it is an object of the present disclosure to provide a SiC semiconductor device and a manufacturing method of a SiC semiconductor device. In the semiconductor device, a contact resistance between a source region and a source electrode is improved even when a damage is removed from an inner wall of a trench.

According to a first aspect of the present disclosure, a SiC semiconductor device includes: a substrate having a first conductive type or a second conductive type and made of SiC; a drift layer disposed on the substrate, made of SiC, and having the first conductive type, wherein the drift layer has an impurity concentration lower than the substrate; a base region disposed on the drift layer, made of SiC, and having the second conductive type; a source region disposed in a surface portion of the base region, made of SiC, and having the first conductive type, wherein the source region has an impurity concentration higher than the drift layer; a contact layer electrically coupling between the source region and the base region, and disposed in another surface portion of the base region; a trench disposed on a surface of the source region to penetrate the source region and the base region, and having a longitudinal direction; a gate insulation film disposed on an inner wall of the trench; a gate electrode disposed in the trench via the gate insulation film; an interlayer insulation film covering the gate electrode, and having a contact hole, from which the source region and the contact layer are partially exposed; a source electrode electrically coupling with the source region and the contact layer via the contact hole; a drain electrode disposed on a backside of the substrate opposite to the drift layer; and a metal silicide film. The source region includes a first source region and a second source region. The second source region has an impurity concentration higher than the first source region. The second source region is disposed at a position shallower than the first source region. A first part of the second source region is covered with the interlayer insulation film, and a second part of the second source region is disposed under the contact hole. The first part of the second source region includes a first portion at a first position near a surface of the second source region and a second portion at a second position deeper than the first position. The first portion of the first part of the second source region has an impurity concentration lower than the second portion of the first part of the second source region. The metal silicide film is disposed on the second part of the second source region. The metal silicide film is made of metal silicide including metal, which is equal to metal of the source electrode. The metal silicide film has a thickness, which is larger than a thickness of the first portion of the first part of the second source region.

In the above device, when a damage removing process is performed, the part of the second source region having the comparatively low impurity concentration and disposed near the surface is disappeared, or the part of the second source region having the comparatively low impurity concentration and disposed near the surface slightly remains. Thus, it takes much time to oxidize the part of the second source region having the comparatively low impurity concentration and disposed near the surface of the region. Thus, an oxidized part of the high impurity portion of the second source region is comparatively small. Even if the part of the second source region having the comparatively low impurity concentration and disposed near the surface slightly remains, the metal silicide film having a thickness larger than the thickness of the part of the second source region having the comparatively low impurity concentration is formed under the source electrode in another portion of the second source region. Accordingly, since the metal silicide film is directly coupled with the part of the second source region having the comparatively high impurity concentration, the contact resistance between the source region and the source electrode is not increased.

According to a second aspect of the present disclosure, a method for manufacturing a SiC semiconductor device includes: forming a drift layer having a first conductive type on a SiC substrate having the first conductive type or a second conductive type, the drift layer being made of SiC and having an impurity concentration lower than the substrate; forming a base region having the second conductive type on the drift layer, the base region being made of SiC; implanting a first conductive type impurity in a surface portion of the base region so that a source region is formed in the surface portion of the base region, the source region being made of SiC, having the first conductive type, and having an impurity concentration higher than the drift layer; forming a contact layer, which electrically couples between the source region and the base region, and is disposed in another surface portion of the base region; forming a trench on a surface of the source region to penetrate the source region and the base region and to reach the drift layer; removing a damage layer on an inner wall of the trench; forming a gate insulation film on the inner wall of the trench; forming a gate electrode in the trench via the gate insulation film; forming an interlayer insulation film, which covers the gate electrode; forming a contact hole in the interlayer insulation film in such a manner that the source region and the contact layer are partially exposed from the interlayer insulation film via the contact hole; forming a source electrode on the interlayer insulation film to electrically couple with the source region and the contact layer via the contact hole; and forming a drain electrode on a backside of the substrate opposite to the drift layer. The forming of the source region includes: forming a first source region; and forming a second source region. The second source region has an impurity concentration higher than the first source region. The second source region is disposed at a position shallower than the first source region. The forming of the second source region includes: forming a first portion at a first position near a surface of the second source region; and forming a second portion at a second position deeper than the first position; and the first portion of the second source region has an impurity concentration lower than the second portion of the second source region.

In the above method, when the damage removing process is performed, the part of the second source region having the comparatively low impurity concentration and disposed near the surface is disappeared, or the part of the second source region having the comparatively low impurity concentration and disposed near the surface slightly remains. Thus, it takes much time to oxidize the part of the second source region having the comparatively low impurity concentration and disposed near the surface of the region. Thus, an oxidized part of the high impurity portion of the second source region is comparatively small. Accordingly, the contact portion between the second source region and the source electrode is prevented from being disappeared. Accordingly, the contact resistance between the source region and the source electrode is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION (First Embodiment)

A first embodiment will be explained as follows. Here, an element in a SiC semiconductor device is a reverse type vertical MOSFET having a trench gate structure.

Figure 1:
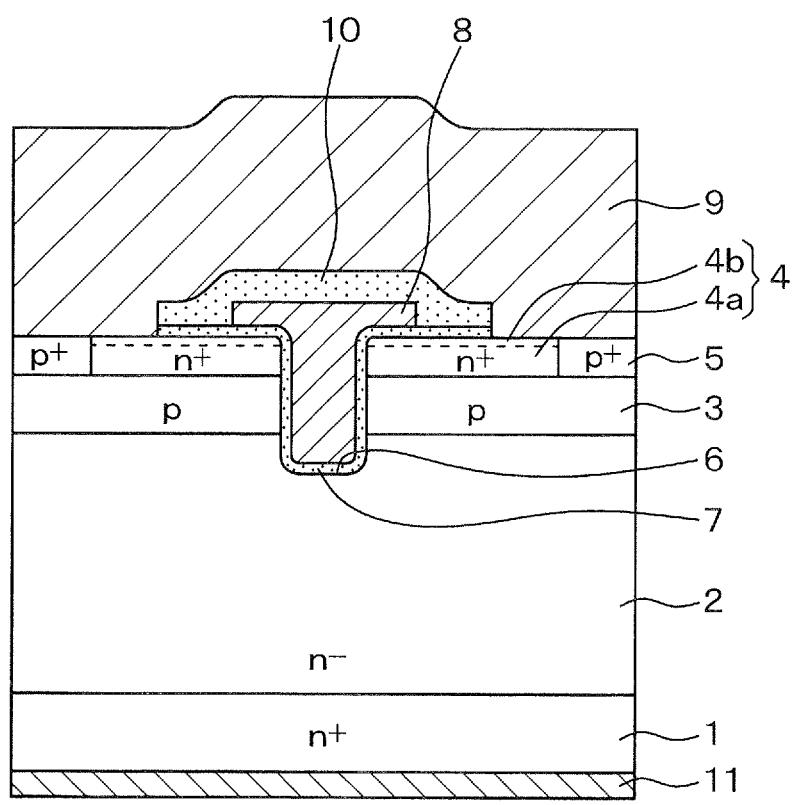
FIG. 1 is a diagram showing a trench gate type vertical MOSFET according to a first embodiment.

FIG. 1 shows a cross sectional view of the vertical MOSFET having the trench gate structure. FIG. 1 corresponds to one cell of the MOSFET. Although FIG. 1 merely shows one cell of the MOSFET, multiple cells similar to the cell in FIG. 1 are arranged along with one direction.

The MOSFET includes a $N^+$ conductive type substrate 1 made of SiC as a semiconductor substrate. The substrate 1 has a N conductive type impurity concentration such as nitrogen and phosphorus of $1.0 \times 10^{19}$ cm$^{-3}$. The thickness of the substrate 1 is about 300 micrometers. A $N^-$ conductive type drift layer 2 is formed on the surface of the substrate 1. The drift layer 2 is made of SiC having the N conductive type impurity concentration such as nitrogen and phosphorus in a range between $3.0\times10^{15}$ cm$^{-3}$ and $7.0\times10^{15}$ cm$^{-3}$. The thickness of the drift layer 2 is in a range between 10 micrometers and 15 micrometers. A P conductive type base region 3 is formed in a surface portion of the drift layer 2. Further, a N$^+$ conductive type source region 4 and a P$^+$ conductive type contact layer 5 are formed in a surface portion of the base region 3.

The base region 3 has a P conductive type impurity concentration such as boron and aluminum in a range between $5.0\times10^{16}$ cm$^{-3}$ and $2.0\times10^{19}$ cm$^{-3}$. The thickness of the base region 3 is about 2.0 micrometers.

The source region 4 is disposed on both sides of the trench gate structure. For example, the thickness of the source region 4 is about 0.3 micrometers. The N conductive type impurity in the source region 4 is mainly nitrogen. The N conductive type impurity in a surface portion of the source region 4 is phosphorous. Since the nitrogen has a weight smaller than phosphorous, the nitrogen ion can be easily implanted at a deeper position than phosphorous. Thus, the part of the source region 4 at a deep position can have the high impurity concentration when the nitrogen is implanted. However, since the contact resistance of the nitrogen implanted source region 4 is not reduced sufficiently to a predetermine value or lower, the phosphorous is used to be implanted in a shallow portion of the source region 4 so that the contact resistance of the phosphorous implanted source region 4 is sufficiently lower than the contact resistance of the nitrogen implanted source region 4. For example, the part of the source region 4, in which only the nitrogen is implanted, has the N conductive type impurity concentration of $1.0\times10^{20}$ cm$^{-3}$, for example. The part of the source region 4, in which the phosphorous is implanted, has the N conductive type impurity concentration of $1.0\times10^{20}$ cm$^{-3}$ or larger. For example, the N conductive type impurity concentration of the part of the source region 4, in which the phosphorous is implanted, is in a range between $5.0\times10^{20}$ cm$^{-3}$ and $1.0\times10^{21}$ cm$^{-3}$. A part of the source region 4 having a comparatively low N conductive type impurity concentration is defined as a first source region 4a, and a part of the source region 4 having a comparatively high N conductive type impurity concentration is defined as a second source region 4b. In the present embodiment, only the nitrogen is implanted in the first source region 4a, and the phosphorous is implanted in the second source region 4b.

The contact layer 5 is formed by increasing the impurity concentration in the base region 3. Thus, the contact layer 5 corresponds to a part of the base region 3. The contact layer 5 functions as a contact between the base region 3 and a source electrode 9. The surface portion of the contact layer 5 has the P conductive type impurity concentration such as boron or aluminum of $1.0\times10^{20}$ cm$^{-3}$. The thickness of the contact layer 5 is about 0.3 micrometers. The contact layer 5 is disposed on an opposite side of the trench gate structure with respect to the source region 4 therebetween.

A trench 6 is formed to penetrate the base region 3 and the source region 4 and reach the drift layer 2. For example, the width of the trench 6 is in a range between 1.4 micrometers and 2.0 micrometers. The depth of the trench 6 is about 2.0 micrometers. For example, the depth of the trench 6 is about 2.4 micrometers. The base region 3 and the source region 4 contact the sidewall of the trench 6.

A gate insulation film 7 covers an inner wall of the trench 6. A gate electrode 8 is formed on a surface of the gate insulation film 7. The gate electrode 8 is made of doped poly silicon. Thus, the gate electrode 8 fills in the trench 6 via the gate insulation film 7. The gate insulation film 7 is made of, for example, an oxide film. The thickness of the gate insulation film 7 is, for example, 100 nanometers. Specifically, the thickness of the gate insulation film 7 at the sidewall of the trench 6 and the thickness of the gate insulation film 7 at the bottom of the trench 6 are the same as 100 nanometers.

Thus, the trench gate structure is prepared. The trench gate structure has a longitudinal direction, which is perpendicular to a sheet of the drawing of FIG. 1. Multiple trench gate structures are arranged in parallel to each other along with a right-left direction of the sheet of the drawing of FIG. 1.

A source electrode 9 and a gate wiring (not shown) are formed on the surface of the gate electrode 8, the surface of the source region 4, and the surface of the contact layer 5. The source electrode 9 and the gate wiring are made of multiple metals such as Ni/Al. At least a part of the source electrode 9 and a part of the gate wiring, which contact a N conductive type SiC such as the source region 4 and the gate electrode 8 in a case where the N conductive type impurity is doped in the gate electrode 8, are made of metal in ohmic contact with the N conductive type SiC. At least a part of the source electrode 9 and a part of the gate wiring, which contact a P conductive type SIC such as the contact layer 5 and the gate electrode 8 in a case where the P conductive type impurity is doped in the gate electrode 8, are made of metal in ohmic contact with the P conductive type SIC. Here, the source electrode 9 and the gate wiring are electrically insulated since the source electrode 9 and the gate wiring are formed on an interlayer insulation film 10. The source electrode 9 is electrically coupled with the source region 4 and the contact layer 5 via a contact hole in the interlayer insulation film 10. The gate wiring is electrically coupled with the gate electrode 8 via a contact hole in the interlayer insulation film 10.

A drain electrode 11 is formed on a backside of the substrate 1. The drain electrode 11 is electrically coupled with the substrate 1. Thus, the reverse type N channel vertical MOSFET having the trench gate structure is manufactured.

Next, a method for manufacturing the trench gate type vertical MOSFET will be explained. FIGS. 2A to 4C show the method for manufacturing the trench gate type vertical MOSFET.

Figure 2A:
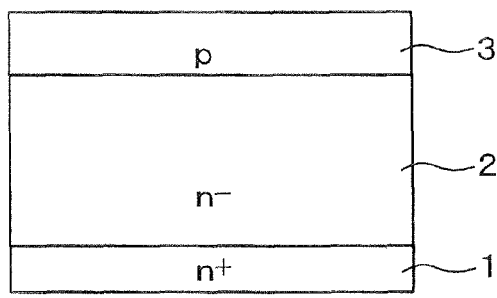
FIGS. 2A to 2D are diagrams showing a manufacturing process of the vertical MOSFET in FIG. 1.

[Step in FIG. 2A]

First, the N$^+$ conductive type substrate 1 having the N conductive type impurity concentration such as nitrogen or phosphorous of $1.0\times10^{19}$ cm$^{-3}$ is prepared. The thickness of the substrate 1 is about 300 micrometers. The N$^-$ conductive type drift layer 2 is formed on the surface of the substrate 1. The N conductive type impurity concentration such as nitrogen or phosphorous of the drift layer 2 is in a range between $3.0\times10^{15}$ cm$^{-3}$ and $7.0\times10^{15}$ cm$^{-3}$. The thickness of the drift layer 2 is about 15 micrometers, and made of SIC. The drift layer 2 is epitaxially grown on the surface of the substrate 1. Then, the P conductive type base region 3 is formed on the surface of the drift layer 2. The P conductive type impurity concentration of the base region 3 is in a range between $5.0\times10^{16}$ cm$^{-3}$ and $2.0\times10^{19}$ cm$^{-3}$. The thickness of the base region 3 is about 2.0 micrometers. The base region 3 is epitaxially grown on the surface of the drift layer 2. Specifically, a P conductive type impurity layer including boron or aluminum is epitaxially grown on the surface of the drift layer 2 so that the base region 3 is formed.

Figure 2B:
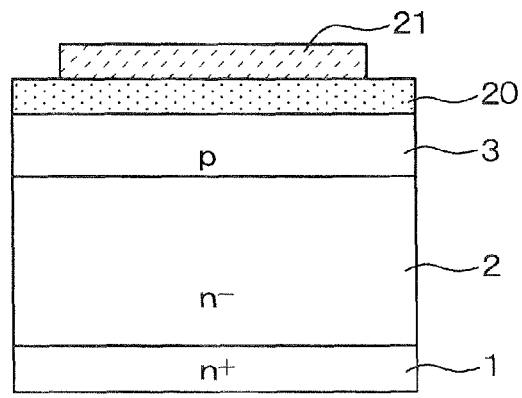

[Step in FIG. 2B]

A mask 20 is deposited on the base region 3. The mask 20 is made of, for example, a LTO film. Then, a resist 21 is arranged on the mask 20. The resist 21 is processed in a photolithography method so that light is irradiated on the resist 21, and then, the resist 21 is developed. Thus, an opening is formed in a part of the resist 21, which corresponds to a P$^+$ conductive type contact layer 5. Thus, the opening of the resist 21 corresponds to a contact-layer-to-be-formed region.

Figure 2C:
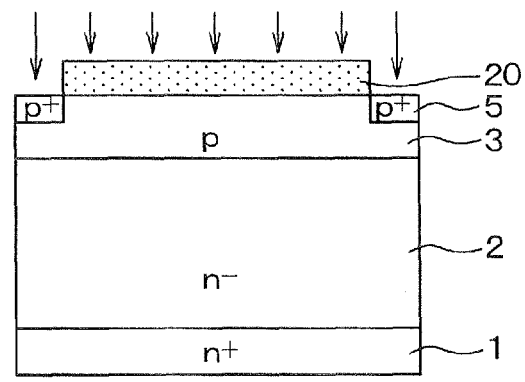

[Step in FIG. 2C]

The mask 20 is patterned via the resist 21 with using an etching gas such as $CHF_3$, which has high selection rate with respect to SIC. Thus, the mask 20 has an opening, which corresponds to the contact-layer-to-be-formed region. Then, the resist 21 is removed. Under a condition that the mask 20 covers the base region 3 other than the contact-layer-to-be-formed region, the P conductive type impurity such as boron and aluminum is implanted. Then, the implanted ions in the base region 3 are activated so that the $P^+$ conductive type contact layer 5 is formed. The surface concentration of the contact layer 5 has the P conductive type impurity concentration such as boron or aluminum of $1.0\times10^{20}$ $cm^{-3}$. The thickness of the contact layer 5 is about 0.3 micrometers. Then, the mask 20 is removed with using an etchant such as HF.

Figure 2D:
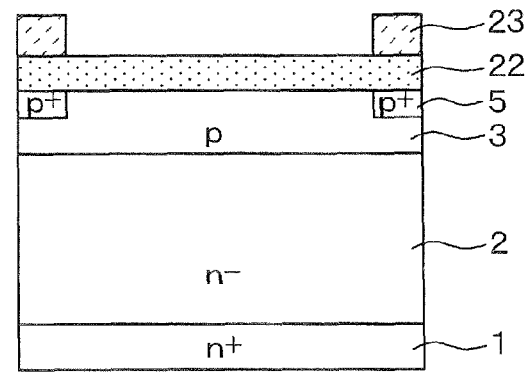

[Step in FIG. 2D]

A mask 22 made of, for example, a LTO film, is deposited on the base region 3 and the contact layer 5. A resist 23 is arranged on the mask 22. The resist 23 is processed in a photolithography method so that light is irradiated on the resist 23, and then, the resist 23 is developed. Thus, an opening is formed in a part of the resist 23, which corresponds to a $N^+$ source region 4. Thus, the opening of the resist 23 corresponds to a source-region-to-be-formed region.

Figure 3A:
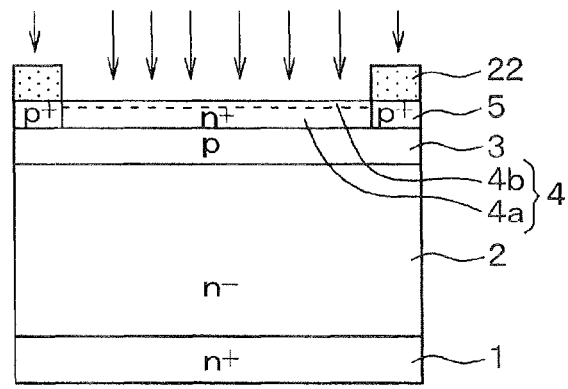
FIGS. 3A to 3D are diagrams showing the manufacturing process of the vertical MOSFET after a step in FIG. 2D.

[Step in FIG. 3A]

With using the resist 23, the mask 22 is patterned via the resist 23 with using an etching gas such as $CHF_3$, which has high selection rate with respect to SiC. Thus, the mask 22 has an opening, which corresponds to the source-region-to-be-formed region. Then, the resist 23 is removed. Under a condition that the mask 22 covers the base region 3 other than the source-region-to-be-formed region, the N conductive type impurity is implanted. In this case, the nitrogen as the N conductive type impurity is implanted in the source region 4 from a shallow position to a deep position in such a manner that the implanted nitrogen in the source region 4 has a box profile. Thus, the first source region 4a having the impurity concentration of $1\times10^{20}$ $cm^{-3}$ is formed. Next, the phosphorous as the N conductive type impurity is implanted in the source region 4 at the shallow position. Thus, the second source region 4b having the impurity concentration of $1\times10^{20}$ $cm^{-3}$ or larger is formed. Thus, the impurity concentration of the second source region 4b is higher than the first source region 4a, in which only the nitrogen is introduced. The second source region 4b functions as a contact portion of the source electrode 9. Specifically, the impurity concentration of the second source region 4b is in a range between $5.0\times10^{20}$ $cm^{-3}$ and $1.0\times10^{21}$ $cm^{-3}$.

Figure 5A:
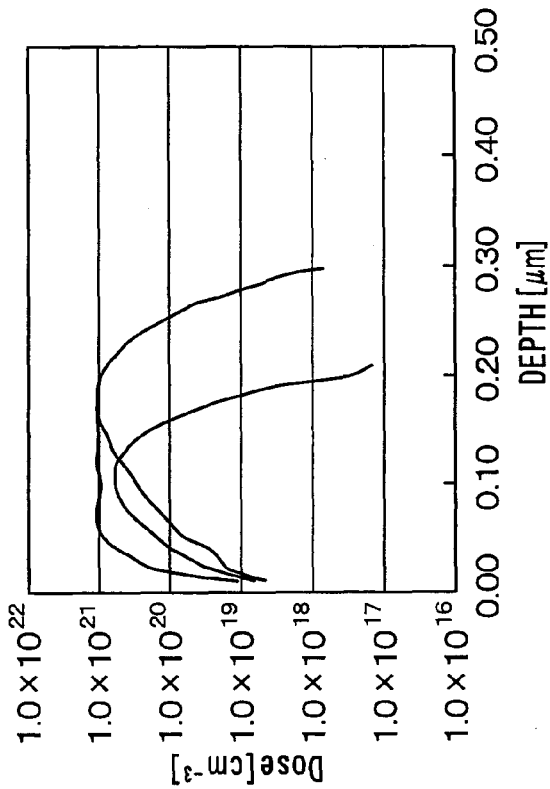
FIGS. 5A and 5B are graphs showing an impurity concentration profile of a certain region of a $N^+$ conductive type source region in a conventional device and the device according to the first embodiment.
Figure 5B:
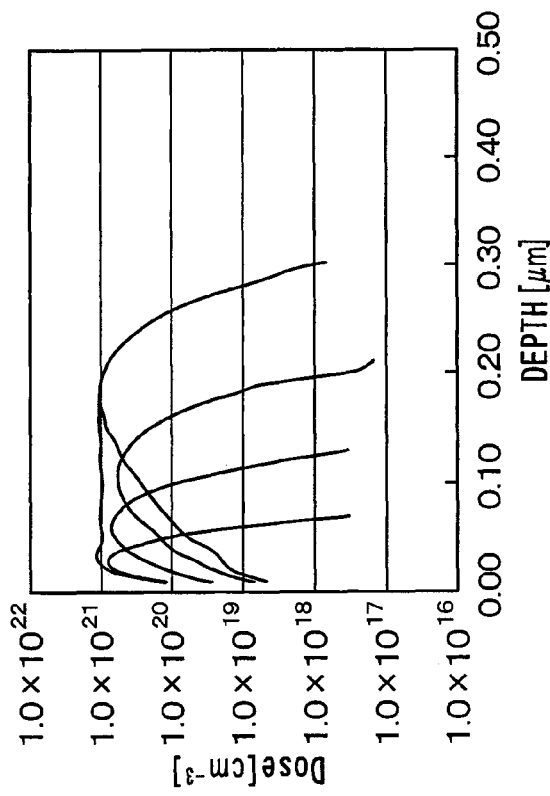

In the above case, in the second source region 4b, the impurity concentration starts to increase at a predetermined distance from the surface of the second source region 4b so that the impurity concentration of the surface portion of the second source region 4b is not high, but a part of the second source region 4b at a position apart from the surface by a predetermined distance is high. FIGS. 5A and 5B show impurity concentration profiles of the second source region 4b in a conventional device and the device according to the present embodiment. The difference of the impurity concentration of the second source region 4b between the conventional device and the device according to the present embodiment will be explained as follows. In FIGS. 5A and 5B, merely the impurity concentration of the second source region 4b is shown. The first source region 4a has the nitrogen concentration of about $1.0\times10^{20}$ $cm^{-3}$.

As shown in FIG. 5A, in the conventional device, the impurity concentration at a position having a small depth such as 0.01 micrometer depth from the surface of the second source region 4b is high, i.e., the impurity concentration of the second source region 4b is high from substantially the surface of the region 4b. In FIG. 5, the impurity concentration of the second source region 4b at almost the surface is $1.0\times10^{21}$ $cm^{-3}$. Thus, the impurity concentration of a whole of the second source region 4b from substantially the surface of the region 4b is high. In this case, a thickness of a part of the second source region 4b having a comparatively low impurity concentration and disposed near the surface of the region 4b is very small.

When a damage removing process such as a sacrifice oxidation process is performed, the substrate 1 is heated at a predetermined temperature for a comparatively long time so as to remove a damage portion sufficiently. Accordingly, when the impurity concentration of the whole of the second source region 4b from substantially the surface of the region 4b is high, the part of the second source region 4b having the comparatively low impurity concentration and disposed near the surface of the region 4b is completely oxidized at a comparative early time of the damage removing process. Thus, the high impurity portion of the second source region 4b is rapidly oxidized. Since the rapid oxidization process time is long, the contact portion between the second source region 4b and the source electrode 9 is disappeared.

As shown in FIG. 5B, in the present embodiment, a part of the second source region 4b at a predetermined depth from the surface of the region 4b such as 0.05 micrometer depth has a comparatively low impurity concentration, which is not the high impurity concentration of $1.0\times10^{21}$ $cm^{-3}$. For example, the impurity concentration of the part of the second source region 4b near the surface is smaller than $1.0\times10^{19}$ $cm^{-3}$. Thus, compared with the impurity concentration profile in FIG. 5A, the thickness of the part of the second source region 4b having a comparatively low impurity concentration and disposed near the surface of the region 4b is thick.

Accordingly, when the damage removing process such as the sacrifice oxidation process is performed after that, the part of the second source region 4b having the comparatively low impurity concentration and disposed near the surface of the region 4b is disappeared, or the part of the second source region 4b having the comparatively low impurity concentration and disposed near the surface of the region 4b slightly remains. Thus, it takes much time to oxidize the part of the second source region 4b having the comparatively low impurity concentration and disposed near the surface of the region 4b. Thus, even if the high impurity portion of the second source region 4b may be rapidly oxidized, an oxidized part of the high impurity portion of the second source region 4b is comparatively small. Thus, the contact portion between the second source region 4b and the source electrode 9 is prevented from being disappeared.

Figure 3B:
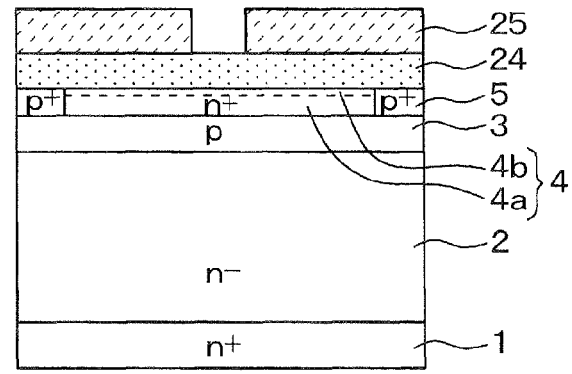

[Step in FIG. 3B]

After the mask 22 is removed, an etching mask 24 is deposited on the base region 3, the source region 4 and the like. The etching mask 24 is made of a LTO film or the like. Then, a resist 25 is arranged on the mask 24. The resist 25 is processed in a photolithography method so that light is irradiated on the resist 25, and then, the resist 25 is developed. Thus, an opening is formed in a part of the resist 25, which corresponds to a trench 6. Thus, the opening of the resist 25 corresponds to a trench-to-be-formed region. The mask 24 is patterned via the resist 25 with using an etching gas such as $CHF_3$, which has high selection rate with respect to SiC. Thus, the mask 24 has an opening, which corresponds to the trench-to-be-formed region.

Figure 3C:
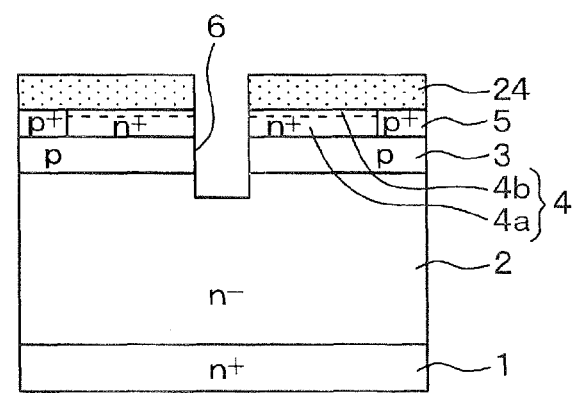

[Step in FIG. 3C]

After the resist 25 is removed, under a condition that the mask 24 covers the surface of the substrate 1 other than the trench-to-be-formed region, the surface is anisotropically etched with using the etching gas such as $SF_6$ gas and $Cl_2$ gas, so that the trench 6 is formed.

Figure 3D:
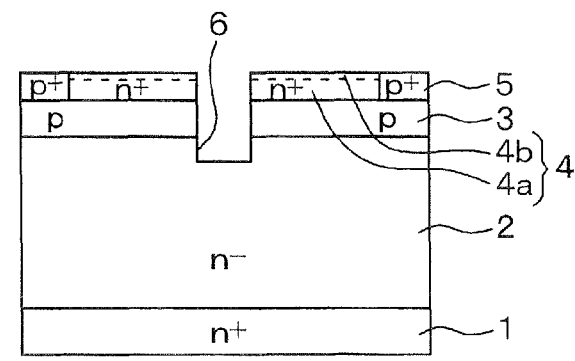

[Step in FIG. 3D]

After that, the etching mask 24 is removed. For example, when the etching mask 24 is made of a $SiO_2$ film such as a LTO film, the mask 24 is removed with using an etchant such as HF.

Figure 4A:
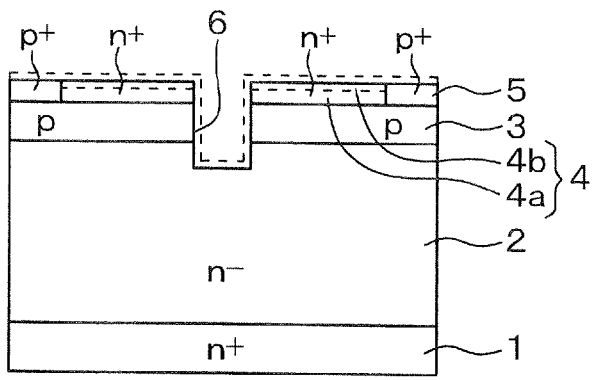
FIGS. 4A to 4C are diagrams showing the manufacturing process of the vertical MOSFET after a step in FIG. 3D.

[Step in FIG. 4A]

The damage portion is removed in a sacrifice oxidation process or the like. For example, the substrate 1 is heated at 1080° C. for 60 minutes in a thermal oxidation process. Then, a formed oxide film is removed with using a hydrofluoric acid. Thus, the exposed surface portion made of SiC including the surface portion of the source region 4 and the inner wall of the trench 6 is sacrifice-oxidized, and then, the damage portion formed in a trench formation process or the like is removed.

In this case, as described above, the part of the second source region 4b at a predetermined depth from the surface of the region 4b has a comparatively low impurity concentration, which is not the high impurity concentration. Thus, compared with the impurity concentration profile in FIG. 5A, the thickness of the part of the second source region 4b having a comparatively low impurity concentration and disposed near the surface of the region 4b is thick. Accordingly, when the damage removing process is performed after that, the part of the second source region 4b having the comparatively low impurity concentration and disposed near the surface of the region 4b is disappeared, or the part of the second source region 4b having the comparatively low impurity concentration and disposed near the surface of the region 4b slightly remains. Thus, it takes much time to oxidize the part of the second source region 4b having the comparatively low impurity concentration and disposed near the surface of the region 4b. Thus, even if the high impurity portion of the second source region 4b may be rapidly oxidized, an oxidized part of the high impurity portion of the second source region 4b is comparatively small. Thus, the contact portion between the second source region 4b and the source electrode 9 is prevented from being disappeared.

In the present embodiment, the damage removing process is the sacrifice oxidation process. Alternatively, even when the damage portion is removed in a hydrogen etching process, a CDE (i.e., chemical dry etching) process or the like, the contact portion between the second source region 4b and the source electrode 9 is prevented from being disappeared.

Figure 4B:
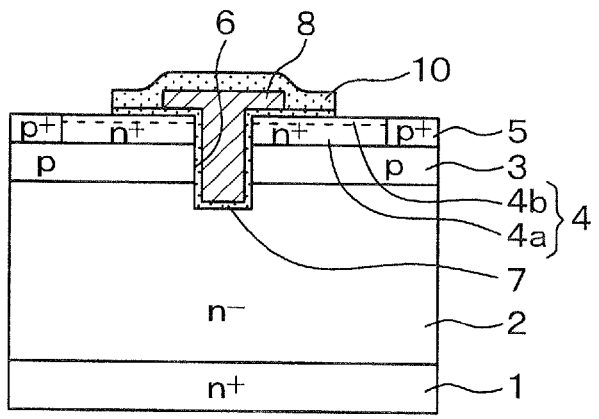

[Step in FIG. 4B]

An oxide film is formed in, for example, a CVD method so that the gate insulation film 7 is deposited. Alternatively, the gate insulation film may be formed by a gate oxidation method. When the gate insulation film 7 is formed by the CVD method, the surface of the second source region 4b is not rapidly oxidized.

Then, a poly crystalline silicon layer, in which a N conductive type impurity or a P conductive type impurity is doped, is formed on the surface of the gate insulation film 7 at 600° C. The poly crystalline silicon layer has a thickness of 120 nanometers. Then, the poly crystalline silicon layer is processed in an etch-back process so that the surface of the poly crystalline silicon layer is flattened. Then, a resist is arranged on the poly crystalline silicon layer. The resist is processed in a photolithography method so that light is irradiated on the resist, and then, the resist is developed. Thus, the resist is patterned. Then, the poly crystalline silicon layer is etched with using the etching gas such as $CF_4$ gas so that the gate electrode 8 is formed. Further, an interlayer insulation film 10 made of an oxide film is formed by the CVD method or the like. The interlayer insulation film 10 is patterned, so that a contact hole is formed in the interlayer insulation film 10. The contact hole corrects to the source region 4 and the contact layer 5.

Figure 4C:
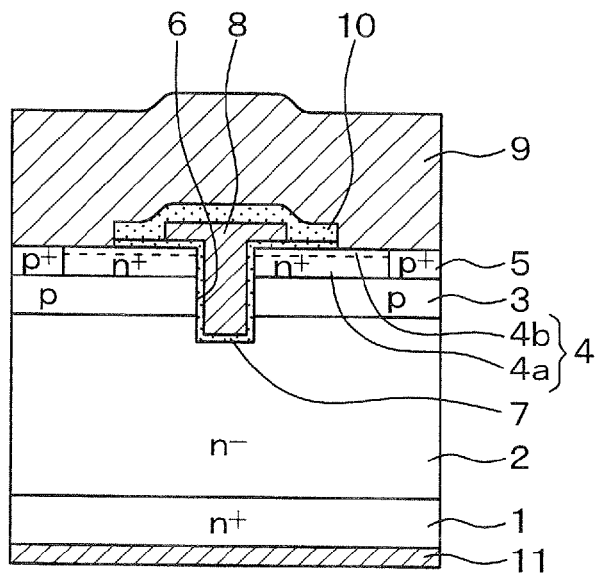

[Step in FIG. 4C]

Then, an electrode material film is deposited to fill the contact hole. Then, the electrode material film is patterned, so that a metal portion of the source electrode 9 in ohmic contact with the P conductive type SiC material is formed. Further, the drain electrode 11 is formed on the backside of the substrate 1. Then, another contact hole connecting to the gate electrode 8 is formed in another portion of the interlayer insulation film 10. Another electrode material film in ohmic contact with the N conductive type SiC material is deposited to fill the other contact hole. Then, the electrode material film is patterned. Further, the electrode material film is sintered so that the source electrode 9 and the gate wiring are formed. Thus, the trench gate type vertical MOSFET is completed.

Thus, in the present embodiment, the part of the second source region 4b at a predetermined depth from the surface of the region 4b has a comparatively low impurity concentration, which is not the high impurity concentration. Accordingly, when the damage removing process is performed after that, the part of the second source region 4b having the comparatively low impurity concentration and disposed near the surface of the region 4b is disappeared, or the part of the second source region 4b having the comparatively low impurity concentration and disposed near the surface of the region 4b slightly remains. Thus, it takes much time to oxidize the part of the second source region 4b having the comparatively low impurity concentration and disposed near the surface of the region 4b. Thus, an oxidized part of the high impurity portion of the second source region 4b is comparatively small. Thus, the contact portion between the second source region 4b and the source electrode 9 is prevented from being disappeared. Accordingly, the contact resistance between the source region 4 and the source electrode 9 is improved.

Figure 6:
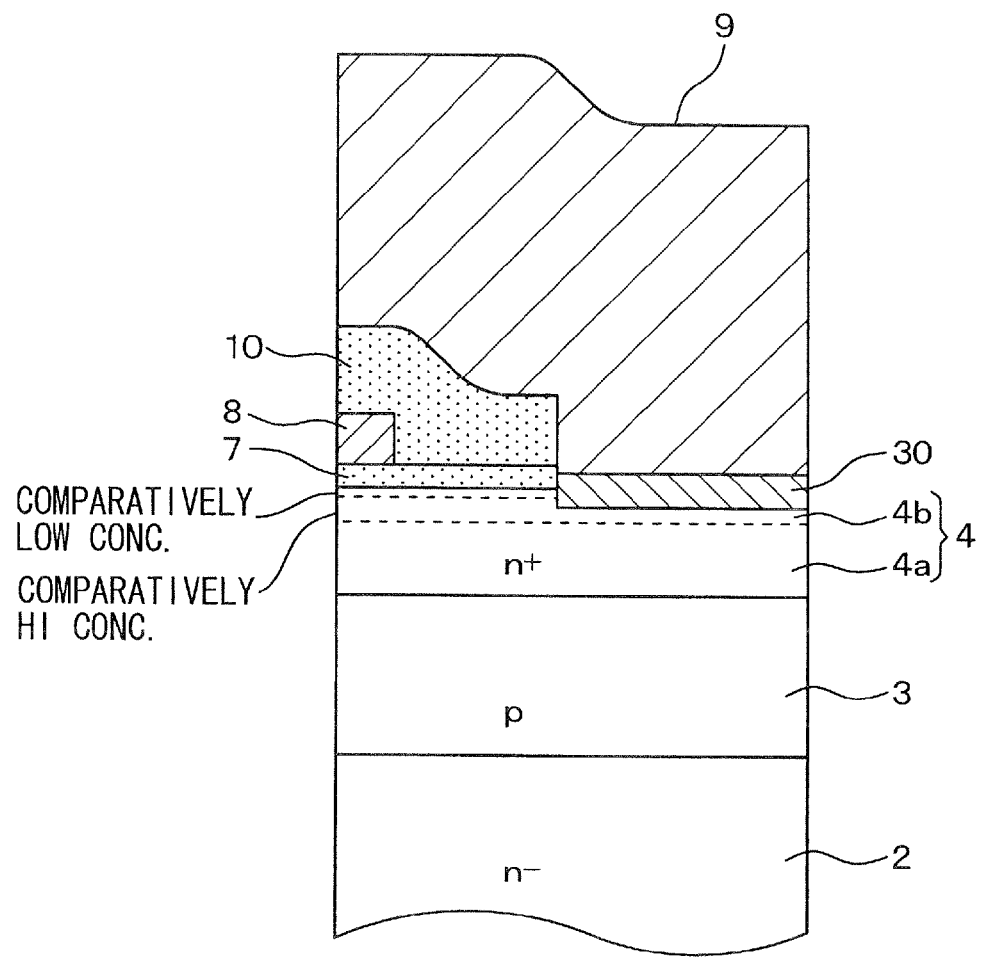
FIG. 6 is a diagram showing a partially enlarged cross sectional view of a contact portion.

When the part of the second source region 4b having the comparatively low impurity concentration and disposed near the surface of the region 4b slightly remains after the damage removing process is performed, the contact resistance between the source region 4 and the source electrode 9 may be increased. However, in the sintering process for forming the source electrode 9, the metal in the source electrode 9 reacted with silicon in the SiC material so that a silicide formation reaction is performed. Thus, the part of the second source region 4b having the comparatively low impurity concentration and disposed near the surface of the region 4b is transformed to metal silicide having a low resistance. In this case, as showing FIG. 6, a portion of the second source region 4b under the interlayer insulation film 10 and the gate insulation film 7 has the comparatively low impurity concentration. In another portion of the second source region 4b under the source electrode 9, a metal silicide film 30 having a thickness larger than the thickness of the part of the second source region 4b having the comparatively low impurity concentration is formed under the source electrode 9. Accordingly, since the metal silicide film 30 is directly coupled with the part of the second source region 4b having the comparatively high impurity concentration, the contact resistance between the source region 4 and the source electrode 9 is not increased.

(Second Embodiment)

A second embodiment will be explained. A contact portion between the source region 4 and the source electrode 9 according to the second embodiment is changed.

Figure 7:
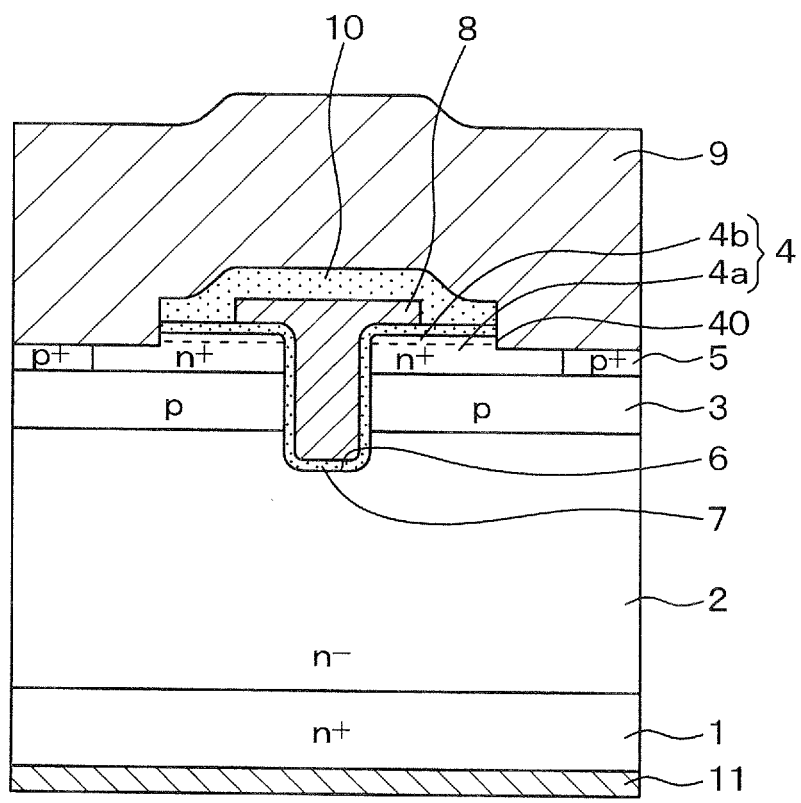
FIG. 7 is a diagram showing a trench gate type vertical MOSFET according to a second embodiment.

FIG. 7 shows a cross sectional view of a trench gate type vertical MOSFET according to the present embodiment. In FIG. 7, the impurity concentration of the surface portion of the second source region 4b is much lower than the first embodiment. For example, the impurity concentration of the surface portion of the second source region 4b is lower than $1.0 \times 10^{18}$ cm$^{-3}$. Further, as shown in FIG. 7, the contact portion between the source region 4 and the source electrode 9 has a concavity 40. Specifically, a surface portion of the source region 4 and a surface portion of the contact layer 5 are removed so that the concavity 40 is formed. The source electrode 9 is electrically coupled with the source region 4 and the contact layer 5 in the concavity 40.

Thus, when the concavity 40 is formed, and further, the source electrode 9 is electrically coupled with the source region 4 and the contact layer 5 in the concavity 40, the part of the second source region 4b having the comparatively low impurity concentration and disposed near the surface of the region 4b does not remain in the contact portion between the source region 4 and the source electrode 9. Thus, the impurity concentration of the part of the second source region 4b having the comparatively low impurity concentration and disposed near the surface of the region 4b can be reduced. When the damage removing process is performed, the oxidation speed of the part of the second source region 4b having the comparatively low impurity concentration is much low. Accordingly, the part of the second source region 4b having the comparatively high impurity concentration is restricted from being rapidly oxidized. Accordingly, the contact resistance between the source region 4 and the source electrode 9 is improved.

A manufacturing method of the trench gate type vertical MOSFET according to the present embodiment will be explained. Specifically, only a difference of the manufacturing method between the MOSFET in FIG. 7 and the MOSFET according to the first embodiment will be explained.

Figure 8A:
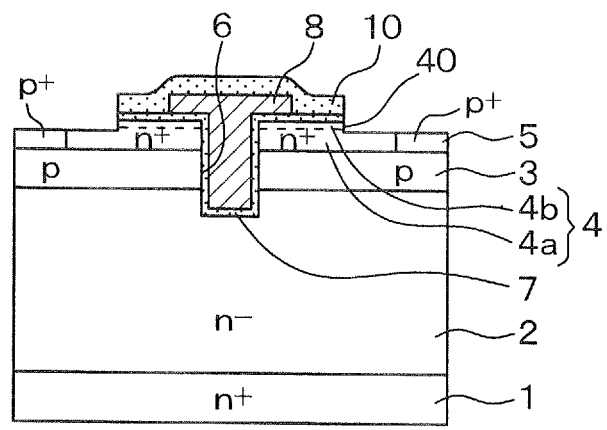
FIGS. 8A to 8B are diagrams showing a manufacturing process of the vertical MOSFET in FIG. 7.
Figure 8B:
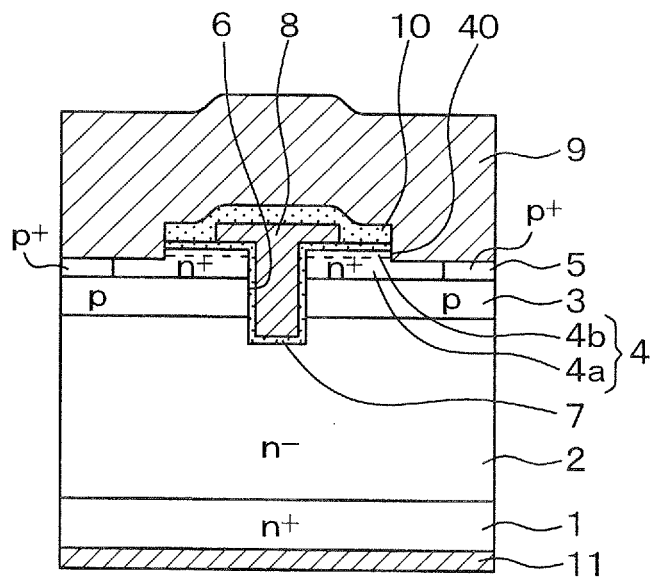

FIGS. 8A and 8B show the manufacturing method of the trench gate type vertical MOSFET in FIG. 7, which are different from the manufacturing method of the trench gate type vertical MOSFET according to the first embodiment in FIGS. 2A to 4C.

The steps shown in FIGS. 2A to 4B are performed. Then, as shown in FIG. 8A, when the contact hole is formed in the interlayer insulation film 10, the surface of the source region 4 and the surface of the contact layer 5 exposed from the contact hole are removed with using the interlayer insulation film 10 as a mask. The interlayer insulation film 10 and the gate insulation film 7 are removed with using an etching gas such as a CHF$_3$ gas. After that, the etching gas is switched to another etching gas such as a SF$_6$ gas or a Cl$_2$ gas, which etches the SiC material with high selection ratio with respect to the SiO$_2$ material, so that the concavity 40 is formed. At this time, the removing amount of the SiC material is controlled with etching time, which is preliminary determined by calculation of the etching rate of the etching gas. The removing amount of the thickness of the source region 4 and the contact layer 5 is larger than the thickness of the remained part of the second source region 4b having the comparatively high impurity concentration after the damage removing process.

After that, as shown in FIG. 8B, the step similar to FIG. 4C is performed, so that the trench gate type vertical MOSFET is completed.

In the present embodiment, the concavity 40 is formed at a position corresponding to the contact hole, and the part of the second source region 4b having the comparatively low impurity concentration and disposed near the surface of the region 4b is removed. Thus, the part of the second source region 4b having the comparatively high impurity concentration is restricted from being rapidly oxidized. Accordingly, the contact resistance between the source region 4 and the source electrode 9 is restricted from increasing.

In the present embodiment, the source electrode 9 fills the concavity 40. Alternatively, the metal material of the source electrode 9 on the surface portion of the source region 4 exposed in the concavity 40 may be processed in a silicide formation process, so that the metal silicide film 30 is formed in the concavity 40.

(Other Embodiments)

In the above embodiments, the first source region 4a is formed with using the nitrogen, and the second source region 4b is formed with using the phosphorous. Alternatively, each of the first and second source regions 4a, 4b may be formed with using the same ion. In this case, the ion implantation process is performed such that the impurity concentration of the shallow second source region 4b is higher than the deep first source region 4a.

In the first embodiment, the N conductive type impurity concentration of the part of the second source region 4b having the comparatively low impurity concentration and disposed near the surface of the region 4b is equal to or lower than $1.0\ 10^{19}$ cm$^{-3}$. Alternatively, in the first embodiment, the N conductive type impurity concentration of the part of the second source region 4b having the comparatively low impurity concentration and disposed near the surface of the region 4b may be equal to or lower than $1.0 \times 10^{18}$ cm$^{-3}$, which is similar to the second embodiment. In the second embodiment, the N conductive type impurity concentration of the part of the second source region 4b having the comparatively low impurity concentration and disposed near the surface of the region 4b is equal to or lower than $1.0 \times 10^{18}$ cm$^{-3}$. Alternatively, in the second embodiment, the N conductive type impurity concentration of the part of the second source region 4b having the comparatively low impurity concentration and disposed near the surface of the region 4b may be equal to or lower than $1.0 \times 10^{19}$ cm$^{-3}$, similar to the first embodiment.

In the above embodiments, the first conductive type is the N conductive type, and the second conductive type is the P conductive type. Thus, the N channel MOSFET is formed. Alternatively, the conductive type of each element may be reversed so that the P channel type MOSFET may be formed. Further, in the above embodiments, the trench gate type MOSFET is formed. Alternatively, the trench gate type IGBT may be formed. In this case, in each embodiment, the conductive type of the substrate 1 is switched from the N conductive type to the P conductive type.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device comprising:
    a substrate having a first conductive type or a second conductive type and made of SiC;

a drift layer disposed on the substrate, made of SiC, and having the first conductive type, wherein the drift layer has an impurity concentration lower than the substrate;

a base region disposed on the drift layer, made of SiC, and having the second conductive type;

a source region disposed in a surface portion of the base region, made of SiC, and having the first conductive type, wherein the source region has an impurity concentration higher than the drift layer;

a contact layer electrically coupling between the source region and the base region, and disposed in another surface portion of the base region;

a trench disposed on a surface of the source region to penetrate the source region and the base region, and having a longitudinal direction;

a gate insulation film disposed on an inner wall of the trench;

a gate electrode disposed in the trench via the gate insulation film;

an interlayer insulation film covering the gate electrode, and having a contact hole, from which the source region and the contact layer are partially exposed;

a source electrode electrically coupling with the source region and the contact layer via the contact hole;

a drain electrode disposed on a backside of the substrate opposite to the drift layer; and a metal silicide film, wherein:

the source region includes a first source region and a second source region;

the second source region has an impurity concentration higher than the first source region;

the second source region is disposed at a position shallower than the first source region and includes a first part and a second part, as well as a first portion and a second portion;

the first part of the second source region is covered with the interlayer insulation film, and the second part of the second source region is disposed under the contact hole;

the first part of the second source region includes the first portion at a first position near a surface of the second source region and the second portion at a second position deeper than the first position;

the first portion of the first part of the second source region has an impurity concentration lower than the second portion of the first part of the second source region;

the metal silicide film is disposed on the second part of the second source region;

the metal silicide film is made of metal silicide including metal, which is equal to metal of the source electrode; and the metal silicide film has a thickness, which is larger than a thickness of the first portion of the first part of the second source region.

2. The SiC semiconductor device according to claim 1 wherein: the second part of the second source region includes only the second portion of the second source region; and the metal silicide film contacts the second part of the second source region so that the metal silicide film is sandwiched between the second part of the second source region and the source electrode.

3. The SiC semiconductor device according to claim 1 wherein:

the impurity concentration of the first portion of the first part of the second source region is equal to or lower than $1.0 \times 10^{19}$ cm$^{-3}$; and the impurity concentration of the second portion of the first part of the second source region is equal to or higher than $1.0 \times 10^{20}$ cm$^{-3}$.

4. The SiC semiconductor device according to claim 3 wherein:

the impurity concentration of the first portion of the first part of the second source region is equal to or lower than $1.0 \times 10^{18}$ cm$^{-3}$.

5. The SiC semiconductor device according to claim 1 wherein:

the second source region and the contact layer have a concavity; and the metal silicide film is disposed in the concavity.

6. The SiC semiconductor device according to claim 5 wherein:

the metal silicide film is formed in such a manner that a whole of the source electrode or the metal in the source electrode in the concavity is transformed to metal silicide.

* * * * *